(12) United States Patent
Okai et al.

(10) Patent No.: US 8,410,474 B2
(45) Date of Patent: Apr. 2, 2013

(54) GRAPHENE GROWN SUBSTRATE AND ELECTRONIC/PHOTONIC INTEGRATED CIRCUITS USING SAME

(75) Inventors: Makoto Okai, Tokorozawa (JP); Motoyuki Hirooka, Kumagaya (JP); Yasuo Wada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/010,075

(22) Filed: Jan. 20, 2011

(65) Prior Publication Data

US 2011/0175060 A1 Jul. 21, 2011

(30) Foreign Application Priority Data

Jan. 21, 2010 (JP) .................................. 2010-015088
Jul. 28, 2010 (JP) .................................. 2010-169124

(51) Int. Cl.
*H01L 29/06* (2006.01)
(52) U.S. Cl. ............. 257/29; 257/E29.09; 257/E29.082; 257/E29.068; 257/E31.003
(58) Field of Classification Search .................. 257/29, 257/E29.09, E29.082, E33.003, E29.068
See application file for complete search history.

(56) References Cited

U.S. PATENT DOCUMENTS

| | | | |
|---|---|---|---|
| 2009/0079040 A1* | 3/2009 | Schultz et al. | 257/632 |
| 2010/0200839 A1* | 8/2010 | Okai et al. | 257/29 |
| 2011/0108802 A1* | 5/2011 | Lin et al. | 257/24 |

OTHER PUBLICATIONS

K. S. Novoselov et al., Two-dimensional gas of massless Dirac fermions in grapheme, Nature, Nov. 10, 2005, pp. 197-199, vol. 438.
Shiro Entani et al., Growth of nanographite on Pt(111) and its edge state, Applied Physics Letters 88, 153126, 2006.
Yu Miyamoto et al., Graphene/graphite formation by heat treatment of a 3C-SiC (111) thin film grown on a Si (110) substrate, Conference Proceedings of the 69yh Autumn Meeting at Chubu University, the Japan Society of Applied Physics, 2008, pp. 202.

* cited by examiner

*Primary Examiner* — Kimberly Rizkallah
*Assistant Examiner* — Timor Karimy
(74) *Attorney, Agent, or Firm* — Antonelli, Terry, Stout & Kraus, LLP.

(57) ABSTRACT

A substrate having a graphene film grown thereon according to the present invention includes: a base substrate; a patterned aluminum oxide film formed on the base substrate, the patterned aluminum oxide film having an average composition of $Al_{2-x}O_{3+x}$ (where x is 0 or more); and a graphene film preferentially grown only on the patterned aluminum oxide film, the graphene film having one or more graphene atomic layers, the graphene film growing parallel to a surface of the patterned aluminum oxide film, the graphene film having an electrical conductivity of $1 \times 10^4$ S/cm or more measured by a four-probe resistive method using an inter-voltage-probe distance of 0.2 mm.

14 Claims, 5 Drawing Sheets

(a)

(b)

(c)

(d)

GRAPHENE GROWN SUBSTRATE AND ELECTRONIC/PHOTONIC INTEGRATED CIRCUITS USING SAME

CLAIM OF PRIORITY

The present application claims priority from Japanese patent application serial no. 2010-169124 filed on Jul. 28, 2010, which further claims priority from Japanese patent application serial no. 2010-010588 filed on Jan. 21, 2010, the contents of which are hereby incorporated by reference into this application.

BACKGROUND OF THE INVENTION

1. Field of the Invention

The present invention relates to graphenes for use in electronic and optical device applications. The invention particularly relates to substrates having a graphene layer grown thereon, and electro-optical integrated circuits formed in such a substrate.

2. Description of Related Art

Graphenes (also called graphene sheets) are a sheet of six-membered rings which does not form a closed surface, and are formed by connecting numerous benzene rings two-dimensionally. Carbon nanotubes are formed by rolling up a graphene sheet into a tubular structure. Graphites are formed by stacking multiple graphene sheets. Each carbon atom in a graphene sheet has an $sp^2$ hybrid orbital, and delocalized electrons are present at opposite surfaces of a graphene sheet.

The following typical physical properties of graphenes have been reported: (a) The carrier mobility is in the order of 200,000 $cm^2$/Vs, which is one order of magnitude higher than those of silicon (Si) crystals and is also higher than those of metals and carbon nanotubes. (b) The 1/f noises of typical nanodevices can be significantly reduced. (c) The refractive index is negative. (d) The surface electrons behave as if they have no mass. Because of these properties, graphenes are identified as a candidate for post-silicon electronic materials.

In order to achieve graphene-based electronic and optical devices, a substrate having a graphene layer grown thereon is needed. Novoselov et al. reports a method for forming graphene on a substrate, in which a graphene film is separated from a highly oriented graphite crystal using an adhesive tape and then the removed graphene layer is transferred to the substrate. See e.g., K. S, NOVOSELOV, A. K. GEIM, S. V. MOROZOV, D. JIANG, M. I. KATSNELSON, I. V. GRIGORIEVA, S. V. DUBONOS, AND A. A. FIRSOV: "Two-dimensional gas of massless Dirac fermions in graphene", Nature 438, 197 (2005).

Entani et al. reports a method for forming a graphite nanolayer on a platinum substrate by chemical vapor deposition using a specially designed ultrahigh vacuum apparatus. See. e.g., Shiro ENTANI, Susumu IKEDA, Manabu KIGUCHI, Koichiro SAIKI, Genki YOSHIKAWA, Ikuyo NAKAI, Hiroshi KONDOH, and Toshiaki OHTA: "Growth of nanographite on Pt(111) and its edge state", Appl. Phys. Lett. 88, 153126 (2006).

Miyamoto et al. reports a method of growing, on an Si $(110)_{Si}$ substrate, an 80-nm thick preferentially $(111)_{SiC}$ oriented thin film of cubic silicon carbide (3C-SiC), and then thermally modifying the 3C-SiC thin film in ultrahigh vacuum. See. e.g., Yu MIYAMOTO, Maki SUEMITSU, Hiroyuki HANDA, and Atsushi KONNO: "Graphene/graphite formation by heat treatment of a 3C-SiC(111) thin film grown on a Si(110) substrate", Conference Proceedings of the 69th Autumn Meeting at Chubu University, the Japan Society of Applied Physics, p. 404 (2008).

The above methods have the following problems: The method reported by Novoselov et al. is feasible on an experimental basis, but is not suitable for industrial applications because it is difficult for the method to provide large size substrates. The method reported by Entani et al. has an advantage in that the graphite nanolayer can be formed at relatively low temperatures (room temperature to 850 K). However, the method has a manufacturing cost problem because it requires a specially designed ultrahigh vacuum apparatus. The method reported by Miyamoto et al. has an advantage in which the graphene film can be formed on Si substrates. However, the method requires high temperature treatment (about 1350° C.) in ultrahigh vacuum, and therefore the type of substrate that can be used is limited and also the manufacturing cost is high.

In order to use a graphene film as a circuit conductor in electronic/photonic devices, the following techniques are at least required: a technique of growing a continuous graphene film having good electrical conduction; a technique of forming a circuit pattern in a graphene film; and a technique of preferentially growing a continuous graphene film only on a desired surface (e.g., on a desired circuit pattern).

SUMMARY OF THE INVENTION

In view of the above-described problems and requirements, it is an objective of the present invention to provide a substrate having a graphene film preferentially grown on a desired surface thereof and to provide an electronic/photonic integrated circuit formed on the invented substrate.

(I) According to one aspect of the present invention, there is provided a substrate having a graphene film grown thereon, which includes:

a base substrate;

a patterned aluminum oxide film formed on the base substrate, the patterned aluminum oxide film having an average composition of $Al_{2-x}O_{3+x}$ (where x is 0 or more); and a graphene film preferentially grown only on the patterned aluminum oxide film, the graphene film having one or more graphene atomic layers, the graphene film growing parallel to a surface of the patterned aluminum oxide film, the graphene film having an electrical conductivity of $1\times10^4$ S/cm or more measured by a four-probe resistive method using an inter-voltage-probe distance of 0.2 mm.

As used herein and in the appended claims, the term "graphene film consisting of multiple atomic layers" refers to a graphene film consisting of 20 or less graphene sheets. A graphene film having more than 20 sheets has physical properties (such as electron mobility) that are almost the same as those of bulk graphites, and as a result various useful properties inherent to graphene will be lost. More preferably, the graphene film of the present invention has 10 or less sheets.

Furthermore, the term "parallel to a substrate" means macroscopically (substantially) parallel to the substrate surface (e.g., "macroscopic" means the order of 1 μm or more)". In this case, microscopic roughness of the substrate surface less than 1 μm is not taken into consideration. For example, the substrate surface having a microscopic roughness less than 10 nm is considered to be flat and smooth (hypothetically leveled off). In other words, fluctuation from parallelism of the graphene layer due to the microscopic surface roughness of a substrate is not taken into consideration.

In the above aspect (I) of the invention, the following modifications and changes can be made.

(i) The graphene film consists of a plurality of graphene domains having an average size of 25 nm or larger.

(ii) A distance between a surface atomic layer of the patterned aluminum oxide film and an atomic layer of the graphene film adjacent to the surface atomic layer of the patterned aluminum oxide film is 0.34 nm or less. As used herein and in the appended claims, the term "atom" includes ions.

(iii) An arithmetic mean surface roughness Ra of the patterned aluminum oxide film is 1 nm or less. As used herein and in the appended claims, the term "arithmetic mean roughness of a surface" refers to the arithmetic mean roughness of the surface of an aluminum oxide film on which a graphene film is to be grown, or refers to the arithmetic mean roughness of the interface between an aluminum oxide film and a graphene film grown on the aluminum oxide film.

(iv) A maximum surface height Rz of the patterned aluminum oxide film is 10 nm or less. As used herein and in the appended claims, the term "maximum height of a surface" refers to the maximum height of the surface of an aluminum oxide film on which a graphene film is to be grown, or refers to the maximum height of the interface between an aluminum oxide film and a graphene film grown on the aluminum oxide film.

(v) An average thickness of the patterned aluminum oxide film is from 100 to 500 nm.

(vi) The base substrate is a single crystalline silicon substrate having a silicon oxide film formed thereon.

(vii) The patterned aluminum oxide film is a circuit pattern having a minimum dimension smaller than 1 µm.

(viii) The circuit pattern is formed using reactive ion etching.

(ix) An area of the substrate is 20 cm$^2$ or more. As used herein and in the appended claims, the term "area of a substrate" means the area of one main surface (e.g., upper surface) of the substrate.

(x) There is provided an electronic-photonic integrated circuit formed on the above-described substrate.

(xi) In the above-described electronic-photonic integrated circuit, at least one of component parts comprising a channel of a field effect transistor, an optical emitting element, an optical receiving element and a wiring line is formed in the graphene film.

(II) According to another aspect of the present invention, there is provided a fabrication method for a substrate having a graphene film grown thereon, which includes:

a substrate preparation step including:

using, as a base substrate, a single crystalline silicon substrate having a silicon oxide film formed thereon; and forming, on at least one main surface of the base substrate, an aluminum oxide film having an average composition of $Al_{2-x}O_{3+x}$ (where x is 0 or more);

a circuit patterning step of forming a desired circuit pattern in the aluminum oxide film; and a graphene film formation step of preferentially growing a graphene film only on the circuit pattern by a chemical vapor deposition method using a carbon compound as a precursor, the graphene film having one or more graphene atomic layers, the graphene film growing parallel to a surface of the aluminum oxide film.

In the above aspect (II) of the invention, the following modifications and changes can be made.

(xii) The circuit patterning step is conducted using reactive ion etching with $CHF_3$ (trifluoromethane, fluoroform) gas.

(xiii) The fabrication method further includes, before the graphene film formation step, a surface smoothing step of smoothing the surface of the aluminum oxide film so that an arithmetic mean surface roughness Ra of the aluminum oxide film becomes 1 nm or less.

(xiv) The chemical vapor deposition method in the graphene film forming step is conducted using acetylene, propylene or methane as a precursor in a non-oxidizing atmosphere at 750 to 1000° C. for 0.1 to 10 min. As used herein and in the appended claims, the term "non-oxidizing atmosphere" means an atmosphere that does not oxidize graphene (for example, an oxygen-free atmosphere such as a vacuum, nitrogen and argon).

ADVANTAGES OF THE INVENTION

According to the present invention, a substrate having a graphene film preferentially grown on a desired surface thereof can be fabricated at low cost. Also, the invention can provide an electronic/photonic integrated circuit formed on the invented substrate.

DETAILED DESCRIPTION OF THE PREFERRED EMBODIMENTS

Figure 1:
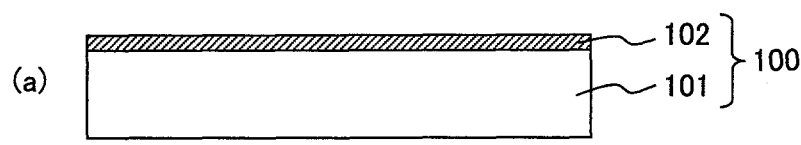
FIG. 1 is schematic illustrations showing cross sectional views of fabrication steps for fabricating a graphene film on a substrate according to an embodiment of the present invention.
Figure 1:
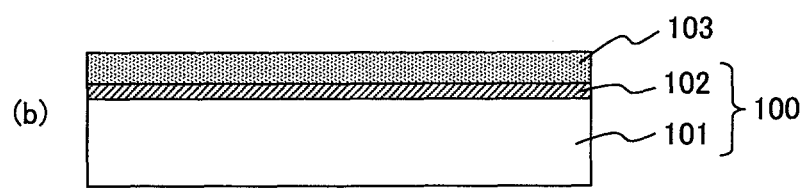
Figure 1:
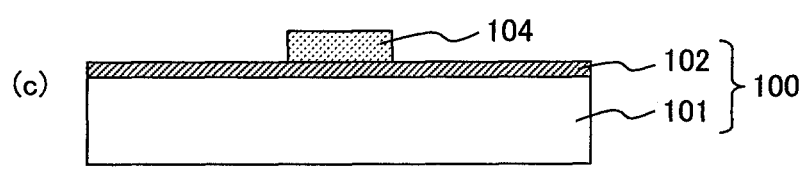
Figure 1:
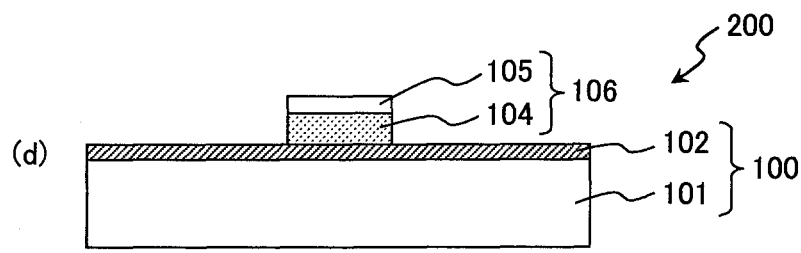

Preferred embodiments of the invention will be described below by following the fabrication sequence and with reference to the accompanying drawings. The invention is not limited to the specific embodiments described below, but various modifications and combinations are possible without departing from the spirit and scope of the invention. In the drawings, like parts are designated by like reference numerals without repeating the description thereof.

FIG. 1 is schematic illustrations showing cross sectional views of fabrication steps for fabricating a graphene film on a substrate according to an embodiment of the present invention. First, as shown in FIG. 1(a), a base substrate 100 is prepared by forming a silicon oxide film 102 (e.g., a 20 to 300 nm thick thermal oxide film) on a single crystalline silicon substrate 101 (e.g., of 2 inch diameter and 500 to 600 µm thickness). Then, as shown in FIG. 1(b), an aluminum oxide film 103 having a corundum structure is formed on the surface of the base substrate 100 (i.e., on the surface of the silicon oxide film 102) by a physical vapor deposition technique (such as sputtering, ion beam deposition and laser evaporation). All the process sub-steps up to this point are collectively referred to as a "substrate preparation step".

The average composition of the aluminum oxide film 103 is preferably $Al_{2-x}O_{3+x}$ ($x \geqq 0$, i.e., x is 0 or more), and more preferably $Al_{2-x}O_{3+x}$ ($x>0$). An aluminum oxide having such a composition can be obtained, for example, by controlling the oxygen partial pressure during vapor deposition. A graphene film having relatively large domains can be grown on such an oxygen-rich aluminum oxide film 103 having an O/Al ratio greater than stoichiometry (which will be described later in detail).

The aluminum oxide film 103 preferably has an arithmetic mean surface roughness Ra of 1 nm or less, and more preferably 0.3 nm or less. At an arithmetic mean surface roughness Ra more than 1 nm, a graphene film does not tend to grow in directions parallel to the surface of the underlying aluminum oxide film 103. This is probably because there is some correlation between the nucleation mechanism of graphene growth on an aluminum oxide film and the arithmetic mean surface roughness Ra of the aluminum oxide film. In addition, the aluminum oxide film 103 preferably has a maximum surface height Rz of 10 nm or less, and more preferably 3 nm or less.

When a resulting aluminum oxide film 103 has an arithmetic mean surface roughness Ra more than 1 nm, its surface is polished by, e.g., chemical mechanical polishing until its arithmetic mean surface roughness Ra becomes 1 nm or less. All the process sub-steps after the "substrate preparation step" to this sub-step are collectively referred to as a "surface smoothing step". Optionally, the single crystalline silicon substrate 101 and/or the silicon oxide film 102 may be polished so as to have an arithmetic mean surface roughness Ra of 1 nm or less before the formation of the aluminum oxide film 103. This sub-step is also included in the "surface smoothing step". As used herein, the term "arithmetic mean surface roughness Ra" and "maximum surface height Rz" are the ones defined in JIS B 0601.

The aluminum oxide film 103 preferably has an average thickness of 10 nm or more and 500 nm or less. An average thickness less than 10 nm is undesirable for the following reason: The crystal grains of the polycrystalline aluminum oxide film 103 do not coalesce sufficiently at thicknesses less than 10 nm (for example, the aluminum oxide film 103 grows like islands). Thus, the surface coverage of the silicon base substrate 100 with the aluminum oxide film 103 is insufficient, resulting in poor surface smoothness of the aluminum oxide film 103. On the other hand, an average thickness more than 500 nm is also undesirable because the resulting aluminum oxide film 103 is prone to suffer from cracks caused by, for example, thermal stresses undergone during subsequent processing, thus resulting in poor surface smoothness (as defined by, e.g., the arithmetic mean surface roughness Ra).

There is no particular limitation on the method for forming the aluminum oxide film 103. Besides physical vapor deposition techniques, any method can be used as long as the above-described preferred average composition (O/Al ratio) and average thickness can be controllably obtained. For example, the aluminum oxide film 103 may be formed by growing an aluminum metal film on the silicon substrate 100 (i.e., on the silicon oxide film 102) followed by oxygen plasma processing or the like.

In addition, the base substrate 100 used to grow the aluminum oxide film 103 thereon is not limited to the above-described silicon oxide film 102 on the single crystalline silicon substrate 101, but other types of substrates may be used. The choice of the substrate is made in consideration of its resistance to thermal cycles during subsequent processes or the specific applications of the graphene film on the substrate (e.g., electronic-photonic integrated circuits). For example, various semiconductor substrates having an insulator film grown thereon and various insulator substrates can be used.

Next, as shown in FIG. 1(c), the aluminum oxide film 103 on the silicon substrate 100 is patterned to form a desired circuit pattern using a conventional semiconductor processing technique. This step is referred to as a "circuit patterning step". In this step, a region 104 of the aluminum oxide film 103 on which a wiring line is to be formed is left unremoved, and the remaining portions of the film 103 are completely removed. However, the silicon oxide film 102 is preferably left unremoved as an insulator layer. The "surface smoothing step" may be conducted after the "circuit patterning step".

There is no particular limitation on the patterning method as long as a desired circuit pattern can be formed as a result. For example, the circuit patterning can be performed using photolithography and wet etching. That is, the above-described region 104 is formed as follows: A resist mask is formed on the aluminum oxide film 103 by photolithography, and the regions of the film 103 that are not covered by the resist mask are etched in a buffered hydrofluoric acid solution. Such a patterning method using photolithography and wet etching can be advantageously employed when the minimum dimension of the circuit pattern is equal to or greater than 1 μm.

However, wet etching cannot be successfully employed to form patterns having a minimum dimension smaller than 1 μm. Circuit patterns having a minimum dimension smaller than 1 μm can be formed using photolithography and liftoff. In this process, the patterning (the formation of a resist mask that covers the portions of the aluminum oxide film 103 to be removed) by photolithography is performed before the formation of the aluminum oxide film 103.

In addition to the above technique using photolithography and liftoff, circuit patterns having a minimum dimension smaller than 1 μm can also be formed using photolithography and dry etching. Aluminum oxides are harder than silicon oxides, and therefore the etching rate of aluminum oxides is generally far smaller than that of silicon oxides. Thus, conventional knowledge teaches that it is difficult to form a circuit pattern of the aluminum oxide film 103 by dry etching for the case that the film 103 is on the silicon oxide film 102. However, the present inventors have found that, for a graphene film on a substrate according to the invention, a circuit pattern can be formed by reactive ion etching using trifluoromethane (fluoroform, $CHF_3$) gas (which will be described later in detail). By using this invented dry etching technique, a fine circuit pattern (having a feature size less than 1 μm or potentially less than 0.5 μm) can be formed in a graphene film on a substrate according to the invention.

After the "circuit patterning step", as shown in FIG. 1(d), a graphene film 105 is formed on the wiring line region 104 of the aluminum oxide film 103 by chemical vapor deposition (CVD) using a carbon-containing compound as a precursor. This is a "graphene film forming step". In this step, circuit wiring 106 is formed, thus completing the fabrication of a substrate 200 (a patterned graphene film on a substrate).

An example of the CVD condition is as follows: The precursor is propylene ($C_3H_6$) and the carrier gas is argon (Ar). The average propylene concentration in the propylene/Ar mixture is 0.15 to 3% by volume. The average flow rate (in standard conditions) of the propylene/Ar mixture gas over the substrate is 15 to 50 standard cm/min. The growth temperature is 450 to 1000° C. (preferably 750 to 1000° C.) and the growth time is 0.1 to 60 min (preferably 0.1 to 10 min). Other carbon-containing compounds (such as acetylene ($C_2H_2$), methane ($CH_4$), propane ($C_3H_8$) and ethylene ($C_2H_4$)) may be employed as the precursor instead of propylene.

(Measurement of Average Number of Graphene Atomic Layers)

The average number of the atomic layers of a graphene film grown according to the present invention was determined by the optical transmittance of the film. The optical transmittance T of one graphene atomic layer is given by Equation (1) (e: electron charge, c: light velocity, and h-bar: reduced Planck constant), and is theoretically predicted to be nearly constant irrespective of wavelength in the wavelength range from visible to infrared.

$$T = \left(1 + 0.5\frac{\pi e^2}{\hbar c}\right)^{-2} \approx 1 - \frac{\pi e^2}{\hbar c} \qquad \text{Equation (1)}$$

Nair et al. reports that one graphene atomic layer has a constant optical transmittance Tc of 97.7% in the wavelength range from visible to infrared. See, e.g., R. R. Nair, P. Blake, A. N. Grigorenko, K. S, Novoselov, T. J. Booth, T. Stauber, N. M. R. Peres, and A. K. Geim: "Fine Structure Constant Defines Visual Transparency of Graphene", SCIENCE 320, 1308 (2008). By assuming Tc=97.7% according to the above report, the average number Lg of the atomic layers of a graphene film grown according to the invention was determined using Equation (2).

$$Lg = \frac{\log_{10}\frac{Tc}{100}}{\log_{10}0.977} \qquad \text{Equation (2)}$$

Figure 2:
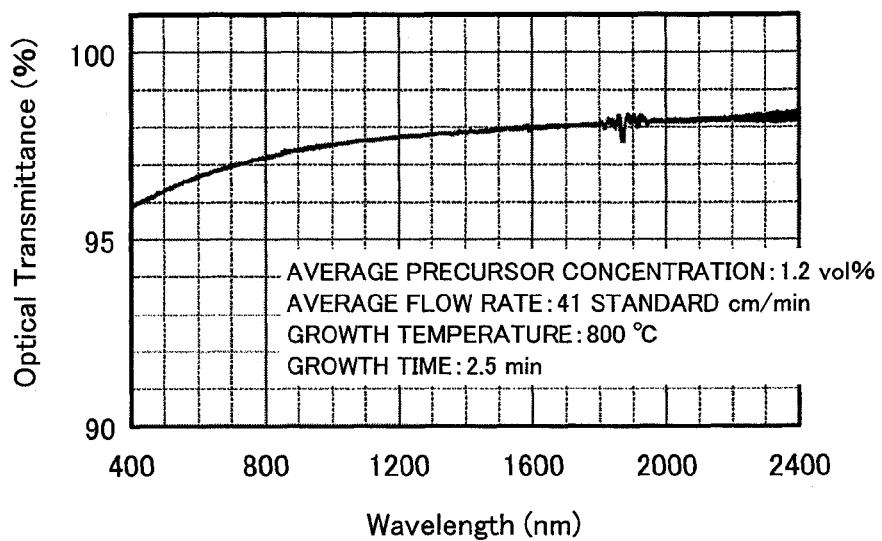
FIG. 2 is a graph of an exemplary optical transmittance spectrum of a graphene film grown on a substrate.

A measurement sample was prepared by growing a graphene film on a single crystalline aluminum oxide (α-alumina) substrate under the following growth condition (precursor: propylene, carrier gas: argon, average precursor concentration: 1.2% by volume, average flow rate: 41 standard cm/min, growth temperature: 800° C., and growth time: 2.5 min). The optical transmittance measured for this sample is shown in FIG. 2. FIG. 2 is a graph of an exemplary optical transmittance spectrum of the above measurement sample. The optical transmittance measured for the above measurement sample was corrected using the optical transmittance of a single crystalline aluminum oxide substrate (without a graphene film) as a reference.

As shown in FIG. 2, the optical transmittance measured gradually increases with increasing wavelength in the shorter wavelength range (from 400 nm to 2000 nm), and remains at a constant value of Tc in the longer wavelength range (longer than about 2000 nm). The ripples between 1800 nm and 1900 nm and longer than 2200 nm are probably a noise due to moisture in the air. By using the thus obtained value for Tc in Equation (2), the average number Lg of the atomic layers of the graphene film of the measurement sample was determined to be 0.7.

(Measurements of Substrate/Graphene Inter-Atomic-Layer Distance and Domain Size)

For a graphene film sample grown according to the present invention, the distance between the atomic layer at the substrate surface and the graphene film's atomic layer adjacent to the substrate surface, and the domain size were measured using a scanning tunneling microscope. Similarly to the sample for the optical transmittance measurement, a sample for this measurement was prepared by growing a graphene film on a single crystalline aluminum oxide substrate. Herein, this sample was grown so that the average number Lg of the atomic layers was less than 1.0. The reason for this is as follows: When a graphene film having an Lg value of less than 1.0 is grown on a substrate, the substrate has both regions on which graphene grows and regions on which graphene does not grow. This structure facilitates the measurements of the inter-atomic-layer distance and domain size.

For the thus prepared graphene film sample having an Lg value of less than 1.0, the measured distance between the atomic layer at the substrate surface and the graphene film's atomic layer adjacent to the substrate surface was 0.30 to 0.34 nm. This distance is nearly equal to the distance between adjacent atomic layers within a graphene film consisting of multiple atomic layers. This result strongly suggests that the graphene film grows in directions parallel to the substrate surface rather than just adhering to the substrate surface.

As for the domain size measurement, it was difficult to determine domain sizes larger than 10 nm using a scanning tunneling microscope. To address this problem, the electrical conductivities of multiple surface spots of a graphene film on a substrate were measured using a scanning tunneling microscope. Then, the domain sizes of the graphene film were determined from the distribution of the electrical conductivities. That is, the difference between the electrical conductivity of surface regions on which a single graphene atomic layer grew and the electrical conductivity of surface regions on which no graphene grew was utilized.

The distribution of the electrical conductivities was obtained as follows: The electrical conductivities of 10000 surface spots (a 100×100 matrix with a pitch of 1 nm) on a 100×100 nm surface area of the graphene film sample were measured. When, for a surface spot, a current of 20 pA or more was measured at an applied voltage of 2.5V, the surface spot was determined to have a graphene grown thereon; when, for a surface spot, a current less than 20 pA was measured at 2.5V, the surface spot was determined to have no graphene grown thereon. A separately conducted measurement showed that a current of 100 pA or more flowed at 2.5V at surface regions having a graphene grown thereon, while no or little current (less than 5 pA at 2.5V) flowed at surface regions having no graphene grown thereon.

Figure 3:
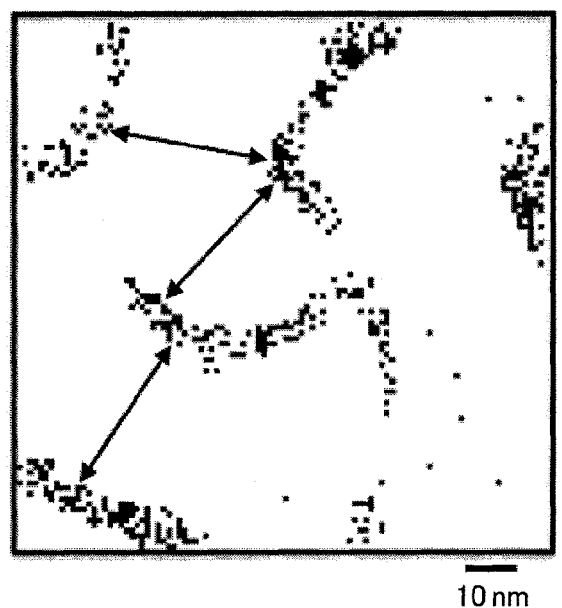
FIG. 3 is a map of an exemplary electrical conductivity distribution measured in a surface area (100×100 nm) of a graphene film grown on a substrate.

FIG. 3 is a map of an exemplary electrical conductivity distribution measured in a surface area (100×100 nm) of a graphene film grown on a substrate. The sample for the measurement in FIG. 3 was prepared by growing a graphene film having an Lg value of 0.7 on a single crystalline aluminum oxide substrate under the following growth condition (precursor: propylene, carrier gas: argon, average precursor concentration: 1.2% by volume, average flow rate: 41 standard cm/min, growth temperature: 800° C., and growth time: 2.5 min). In FIG. 3, a surface spot that is determined to have a graphene grown thereon is marked with a white dot; a surface spot that is determined to have no graphene grown thereon is marked with a black dot.

In FIG. 3, it is natural to think that lines consisting of black dots are graphene domain boundaries. Based on this natural thought, it is determined that a region surrounded by black dot lines is a graphene domain, and the size of the graphene domain is the width of the region (as indicated by a double-pointed arrow in FIG. 3). The average domain size of a graphene film was determined as follows: The electrical conductivity distribution measurement was conducted for ten surface areas (each being 100×100 nm), and the sizes of three domains in each surface area were measured. The average domain size was calculated by averaging the total of the 30 domain sizes measured.

(Influence of Growth Condition on Graphene Film Properties)

The influence of the growth condition on the properties of a graphene film was investigated. A single crystalline aluminum oxide substrate was used for this investigation. First, the relationship between the average number of graphene atomic layers and the growth condition (temperature and time) was investigated. In this investigation, two different conditions for the average precursor concentration and the average flow rate (in standard conditions) were employed, and the above-mentioned relationship was investigated for each condition. The condition for the average precursor concentration and the average flow rate was changed by changing the flow rate of the carrier gas (argon) while fixing the flow rate of the precursor gas (propylene).

Figure 4:
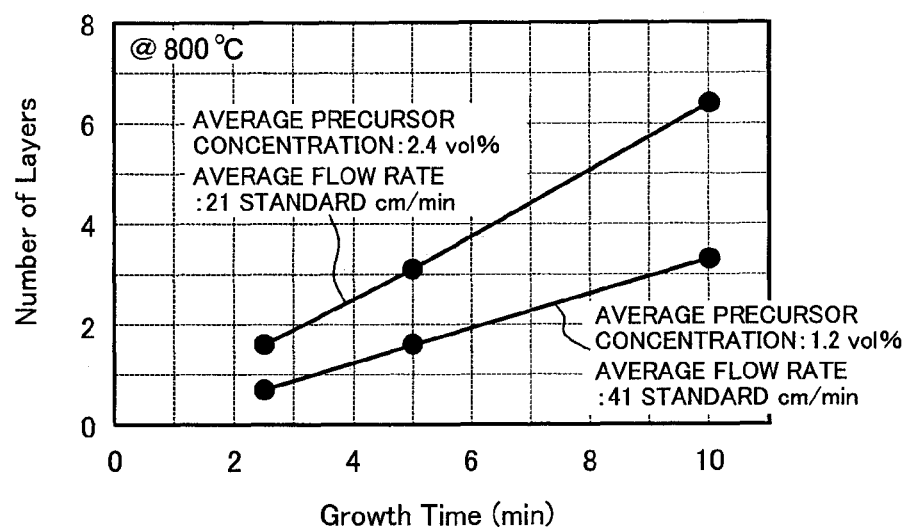
FIG. 4 is a graph showing a relationship between an average number of atomic layers of a graphene film and a growth time at a growth temperature of 800° C.
Figure 5:
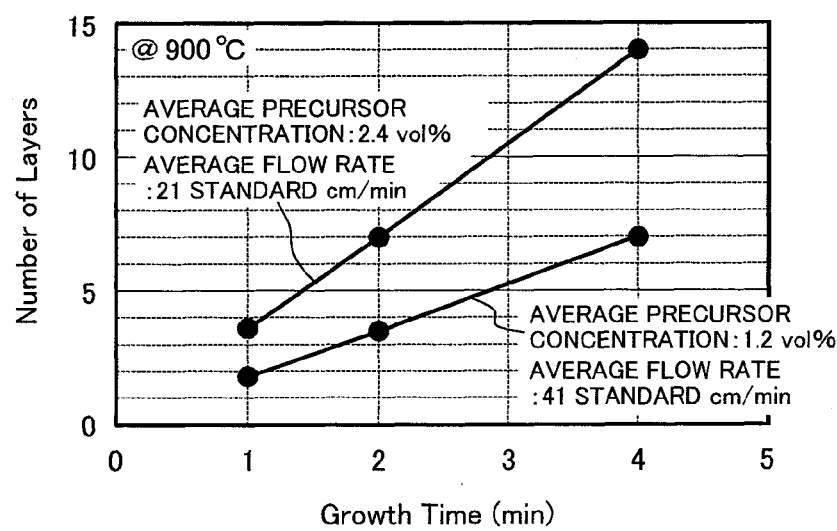
FIG. 5 is a graph showing a relationship between an average number of atomic layers of a graphene film and a growth time at a growth temperature of 900° C.

FIG. 4 is a graph showing a relationship between the average number of the atomic layers of a graphene film and the growth time at a growth temperature of 800° C. FIG. 5 is the same as FIG. 4 except that the growth temperature is 900° C. As shown in FIGS. 4 and 5, the average number of the atomic layers of a graphene film is proportional to the growth time and is increased with increasing average precursor concentration. This result shows that the average number of the atomic layers of a graphene film can be changed mainly by changing the growth time.

Next, the influence of the growth temperature on the average domain size of a graphene film was investigated. The average number of the atomic layers of the graphene films used to perform this investigation was less than 1.0. The result showed that the average domain size was approximately 29 nm at a growth temperature of 800° C., and approximately 31 nm at 900° C. Thus, the growth temperature probably did not significantly influence the average domain size (i.e., the growth temperature was not a main factor affecting the average domain size).

Further, the influence of the growth time on the average domain size of a graphene film was investigated. This investigation was done by changing the growth time while maintaining the average number of graphene atomic layers at 0.5 to 1.0. The result showed that the variation in average domain size was less than 10% irrespective of the growth time. Thus, like the growth temperature, the growth time probably did not significantly influence the average domain size (i.e., the growth time was not a main factor affecting the average domain size).

(Relationship Between Average Composition of Aluminum Oxide ($Al_{2-x}O_{3+x}$) Film and Graphene Domain Size)

The relationship between the average composition (O/Al ratio) of the underlying aluminum oxide ($Al_{2-x}O_{3+x}$) film and the graphene domain size was investigated. As already described, in forming an aluminum oxide film 103 by a physical vapor deposition technique (such as sputtering, ion beam deposition and laser evaporation), the O/Al ratio of the aluminum oxide film 103 can be changed by controlling the oxygen partial pressure during the vapor deposition. In this investigation, 150 nm thick films of aluminum oxides ($Al_{2-x}O_{3+x}$) were formed on a substrate by sputtering. Each aluminum oxide ($Al_{2-x}O_{3+x}$) had a different O/Al ratio (i.e., in each aluminum oxide a different number of oxygen atoms occupied aluminum lattice sites). The O/Al ratio was changed by changing the oxygen/argon partial pressure ratio in the sputtering atmosphere. The substrate used was a 200 nm thick Si oxide film thermally grown on a single crystalline silicon substrate (diameter: 2 inches, and thickness: 525 μm).

The average compositions of the thus formed aluminum oxide ($Al_{2-x}O_{3+x}$) films were measured using an X-ray photoelectron spectroscopy (XPS) apparatus manufactured by Shimadzu Corporation. The result showed that each of the thus formed aluminum oxide ($Al_{2-x}O_{3+x}$) films had a different x value (from −0.3 to 0.32). Also, the thus formed aluminum oxide ($Al_{2-x}O_{3+x}$) films had an arithmetic mean surface roughness Ra of 1 nm or less. Then, on each aluminum oxide ($Al_{2-x}O_{3+x}$) film was formed a graphene film having an Lg value of 0.7 under the following growth condition (precursor: propylene, carrier gas: argon, average precursor concentration: 1.2% by volume, average flow rate (in standard conditions): 41 standard cm/min, growth temperature: 800° C., and growth time: 2.5 min). The average domain size of the thus grown graphene films was determined by the above-described electrical conductivity distribution measurement.

Figure 6:
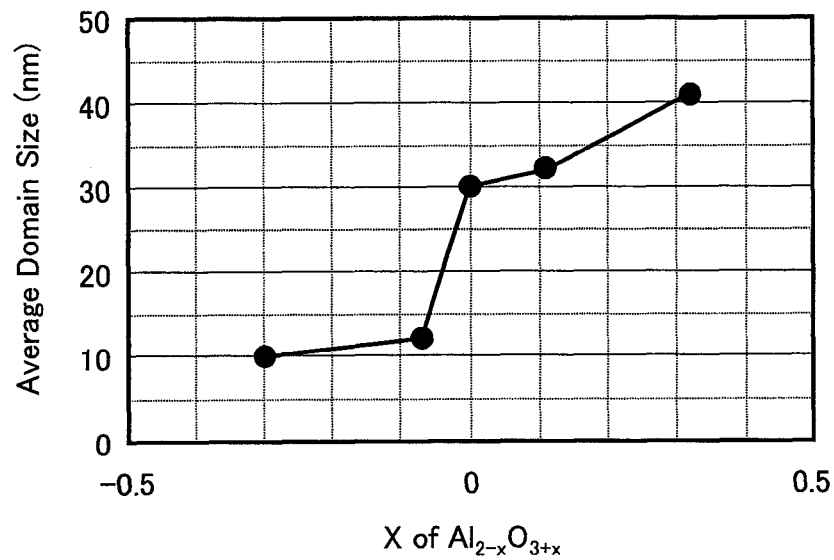
FIG. 6 is a graph showing a relationship between an average domain size of a graphene film and x value in an underlying $Al_{2-x}O_{3+x}$ film.

FIG. 6 is a graph showing a relationship between an average domain size of a graphene film and an elemental concentration of oxygen in an underlying aluminum oxide ($Al_{2-x}O_{3+x}$) film (specifically, an x value in the $Al_{2-x}O_{3+x}$ film). As shown in FIG. 6, the greater the x value in an underlying $Al_{2-x}O_{3+x}$ film, the larger the average domain size of a graphene film grown on the $Al_{2-x}O_{3+x}$ film. In particular, a graphene film having a larger average domain size can be formed on an aluminum oxide ($Al_{2-x}O_{3+x}$) film having an x value of 0 or more (i.e., an oxygen rich aluminum oxide film having an elemental concentration of oxygen equal to or higher than stoichiometry). As can also be seen from FIG. 6, it is more preferable that the x value is more than 0 (i.e., x>0).

(Relationship Between Graphene Average Domain Size and Electrical Conductivity)

In order to use a graphene film as a circuit conductor in electronic and optical devices, the graphene film must have good electrical conductivity. Such a graphene film must consist of domains that are continuous and electrically connected with one another. In view of this requirement, the electrical conductivity of graphene films was investigated.

The samples for this investigation were fabricated according to the fabrication steps of FIG. 1. First, aluminum oxide films having a corundum structure were formed on a silicon oxide ($SiO_2$) film thermally grown on a single crystalline silicon substrate by sputtering. The elemental concentration of oxygen in the aluminum oxide ($Al_{2-x}O_{3+x}$) films were changed by changing the oxygen partial pressure in the sputtering atmosphere. The thus formed aluminum oxide ($Al_{2-x}O_{3+x}$) films had an arithmetic mean surface roughness Ra of 1 nm or less. Then, several striplines (2 μm wide and 1 mm long) were formed in each aluminum oxide film by photolithography and liftoff. Herein, the regions other than the striplines were completely removed. Finally, a graphene film having an Lg value of approximately 1.0 was grown on each of the above substrates (having the striplines) under the following growth condition (precursor: propylene, carrier gas: argon, and growth temperature: 800° C.). As described above, each of the thus grown graphene films had a different average domain size.

The thus formed graphene films were observed under a scanning tunneling microscope. For all of the graphene films, a graphene film grew only on the striplines, and no graphene film grew on the thermal Si oxide film (where the overlying aluminum oxide film had been removed). In other words, a graphene film preferentially grew only on the striplines of each aluminum oxide film. This result suggests that there is some difference in the nucleation and crystal growth mechanisms of graphene between on an aluminum oxide film and on a thermal Si oxide film.

Figure 7:
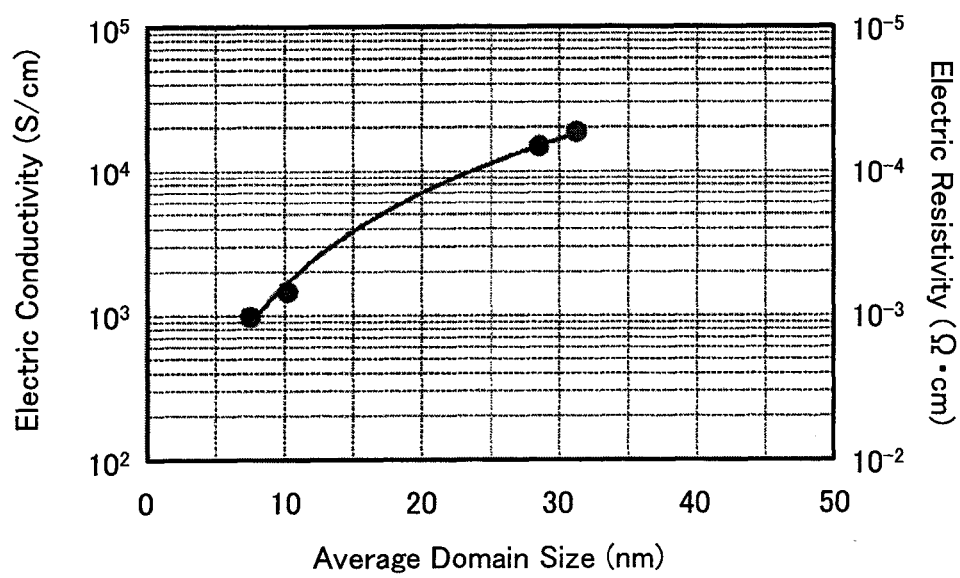
FIG. 7 is a graph showing a relationship between an average domain size of a graphene film and an electrical conductivity and resistivity of the graphene film.

Next, the electrical conductivity and resistivity of the graphene film on a stripline of each sample were measured by a four-probe resistive method. The inter-probe-distance (the distance between voltage probes) was 0.2 mm. FIG. 7 is a graph showing a relationship between an average domain size of a graphene film and an electrical conductivity and resistivity of the graphene film. In FIG. 7, the left ordinate axis represents the electrical conductivity, and the right ordinate axis represents the electrical resistivity.

As can be seen from FIG. 7, the electrical conductivity dramatically increases with increasing average domain size. More specifically, as the average domain size of a graphene film increases from around 10 nm to around 30 nm, the electrical conductivity increases by about one order of magnitude to greater than $1 \times 10^4$ S/cm. Thus, in order to obtain a graphene film having an electrical conductivity of greater than $1 \times 10^4$ S/cm, the average domain size is preferably larger than about 25 nm. The above result demonstrates that a graphene film grown on a substrate according to the present invention has domains that are continuous and electrically connected with one another, and as a result has good electrical conductivity.

(Dry Etch Rate of Aluminum Oxide Film)

Figure 8:
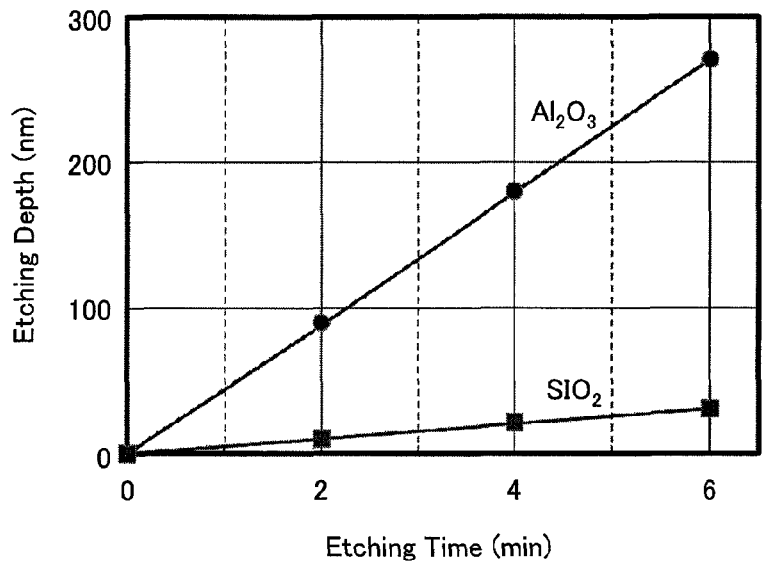
FIG. 8 is a graph showing a relationship between an etching depth and an etching time for a reactive ion etching of a silicon oxide film and an invented aluminum oxide film.

In order to investigate the dry etch rate of aluminum oxide films of the present invention, the following sample was prepared: A 300 nm thick silicon oxide ($SiO_2$) film 102 thermally grown on a single crystalline silicon substrate 101 was prepared. Then, a 300 nm thick aluminum oxide ($Al_{2-x}O_{3+x}$, x>0) film 103 was formed on the silicon oxide film 102 by sputtering. Finally, a part of the aluminum oxide film 103 was completely removed by photolithography and liftoff, thereby exposing a part of the silicon oxide film 102 at the surface of the sample. Then, the above sample was subjected to a reactive ion etching process (etching gas: $CHF_3$, gas pressure: 1.0 Pa, and etching power: 100 W). FIG. 8 is a graph showing a relationship between an etching depth and an etching time for the reactive ion etching of the silicon oxide film 102 and the aluminum oxide film 103.

As shown in FIG. 8, for both the silicon oxide film 102 and the aluminum oxide film 103, the etching depth was nearly proportional to the etching time. From the slopes of the two generally straight lines in FIG. 8, the etching rates of the aluminum oxide film 103 and the silicon oxide film 102 were calculated to be about 45 nm/min and about 5 nm/min, respectively. Thus, the etching rate of the aluminum oxide film 103 is as high as about nine times that of the silicon oxide film 102. The above result held true also for an aluminum oxide ($Al_{2-x}O_{3+x}$, x=0) film 103. Such a sufficiently large etch rate ratio enables high resolution circuit patterning.

As an example, the following patterning was carried out: First, a 30 nm thick aluminum oxide ($Al_{2-x}O_{3+x}$, x>0) film 103 was formed on a 100 nm thick silicon oxide film 102 thermally grown on a single crystalline silicon substrate 101. Then, a circuit pattern was formed in this aluminum oxide film 103 by photolithography and reactive ion etching using the above-mentioned etching condition (etching gas: $CHF_3$, gas pressure: 1.0 Pa, etching power: 100 W, and etching time: 1 min). The result showed that a fine pattern (30 nm×100 nm in horizontal size) was formed. The above-described high dry etch rate ratio and achievement of fine patterning are a remarkably good result unpredictable from conventional knowledge in the art.

The detailed reason for such a good result is not clarified at present. However, a possible reason lies in the fact that the aluminum oxide film 103 of the invention is an oxygen rich aluminum oxide film having an elemental concentration of oxygen higher than stoichiometry. On the other hand, the same good result was also obtained for a stoichiometric aluminum oxide film 103 (i.e., an $Al_{2-x}O_{3+x}$ film where x=0). The reason for this is probably as follows: In this invention, the elemental concentration of oxygen in the aluminum oxide film 103 was controlled by changing the oxygen partial pressure during a vapor deposition. In such a vapor deposition, the oxygen partial pressure may be uneven across the surface of a substrate. Therefore, even when the resulting aluminum oxide film 103 is stoichiometric on average, it may contain both oxygen-rich local microscopic portions and oxygen-poor local microscopic portions. And, such oxygen-rich portions may contribute to the high dry etch rate of the invention.

(Electronic-Photonic Integrated Circuit Formed on Graphene Film on Substrate)

Figure 9:
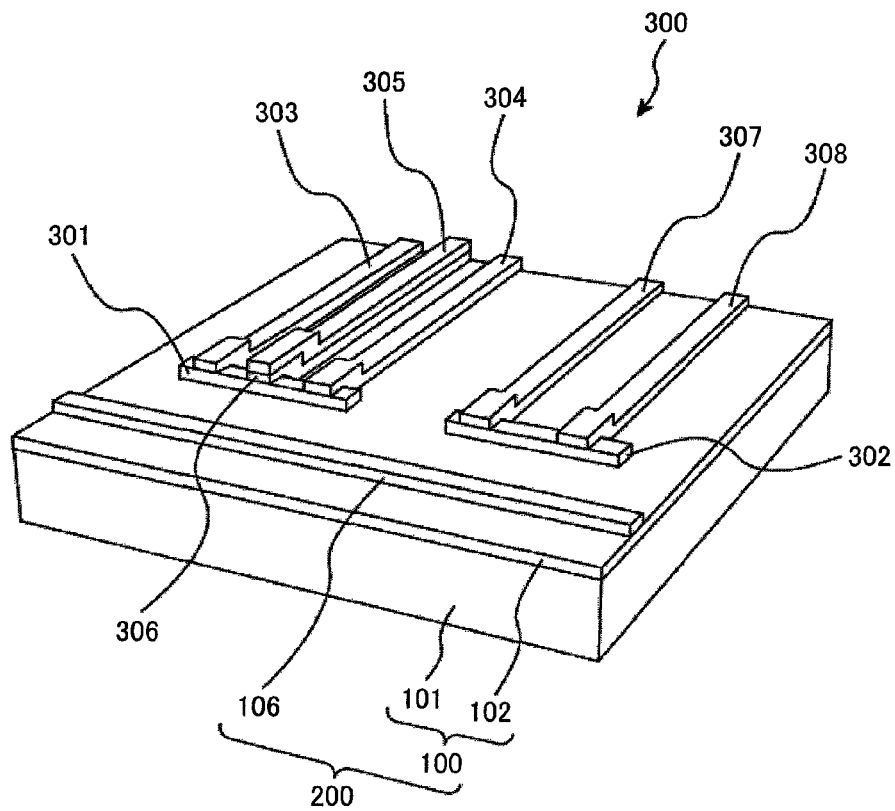
FIG. 9 is a schematic illustration showing a perspective view of an example of an electronic-photonic integrated circuit formed on an invented graphene-on-substrate.

FIG. 9 is a schematic illustration showing a perspective view of an example of an electronic-photonic integrated circuit formed on an invented graphene-on-substrate. An electronic-photonic integrated circuit 300 in FIG. 9 is formed, for example, as follows: First, a substrate 200 (having graphene wiring lines 106 formed on its surface) is prepared. Then, a channel region 301 of a graphene field effect transistor is formed in a part of the wiring lines 106 and also an active region 302 of a graphene optical emitting/receiving element is formed in another part of the wiring lines 106. Then, the channel region 301 of the graphene field effect transistor is provided with a source electrode 303, a drain electrode 304, and a gate electrode 305 on a gate dielectric 306.

The active region 302 of the graphene optical emitting/receiving element is provided with a positive electrode 307 and a negative electrode 308. In graphene optical emitting devices, electrons and holes are injected from the opposite electrodes into the graphene active region having a certain band gap, where they combine by direct transition to generate light. Graphene optical receiving devices detect light in the following manner: Electrons and holes are generated in the graphene active region having a certain band gap by light irradiation, and the thus generated electrons and holes are collected by applying a voltage across the opposite electrodes.

As has been understood from the above discussion, the method for forming a graphene film on a substrate according to the present invention does not require any ultrahigh vacuum processes or any special manufacturing equipment, and therefore the manufacturing equipment cost can be suppressed. In addition, the graphene film according to the invention can be grown at relatively low temperatures, and therefore cheap and large substrates conventionally widely employed in many electronic devices can be used as a starting substrate. Thus, the graphene film on a substrate of the invention can be manufactured at very low cost, and therefore is suitable for industrial applications. Furthermore, field effect transistors, optical emitting/receiving devices and wiring lines can be formed in the graphene film of the invention. Therefore, the graphene film of the invention will contribute to the realization of future electronic-photonic integrated circuits.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A substrate having a graphene film grown thereon, comprising:
   a base substrate;
   a patterned aluminum oxide film formed on the base substrate, the patterned aluminum oxide film having a composition of $Al_{2-x}O_{3+x}$ (where x is 0 or more), a desired circuit pattern of the patterned aluminum oxide film being formed on the base substrate, no aluminum oxide film bein disposed on the base substrate in regions other than the desired circuit pattern; and a graphene film preferentially grown directly and only on the patterned aluminum oxide film, the graphene film having one or more graphene atomic layers, the graphene film growing parallel to a surface of the patterned aluminum oxide film, the graphene film consisting of a plurality of graphene domains having an average size from 25 to 41 nm, the graphene film having an electrical conductivity of $1\times10^4$ S/cm or more measured by a four-probe resistive method using an inter-voltage-probe distance of 0.2 mm.

2. The substrate according to claim 1, wherein a distance between a surface atomic layer of the patterned aluminum oxide film and an atomic layer of the graphene film adjacent to the surface atomic layer of the patterned aluminum oxide film is 0.34 nm or less.

3. The substrate according to claim 1, wherein an arithmetic mean surface roughness Ra of the patterned aluminum oxide film is 1 nm or less.

4. The substrate according to claim 1, wherein a maximum surface height Rz of the patterned aluminum oxide film is 10 nm or less.

5. The substrate according to claim 1, wherein an average thickness of the patterned aluminum oxide film is from 10 to 500 nm.

6. The substrate according to claim 1, wherein the base substrate is a single crystalline silicon substrate having a silicon oxide film formed thereon.

7. The substrate according to claim 6, wherein the desired circuit pattern of the patterned aluminum oxide film has a minimum dimension smaller than 1 μm.

8. The substrate according to claim 7, wherein the desired circuit pattern is formed using reactive ion etching.

9. The substrate according to claim 1, wherein an area of the substrate is 20 cm$^2$ or more.

10. An electronic-photonic integrated circuit formed on the substrate according to claim 1.

11. The electronic-photonic integrated circuit according to claim 10, wherein at least one of component parts comprising a channel of a field effect transistor, an optical emitting element, an optical receiving element and a wiring line is formed in the graphene film.

12. A substrate having a graphene film grown thereon, comprising:
a base substrate;
a patterned aluminum oxide film formed on the base substrate, the patterned aluminum oxide film having a composition of $Al_{2-x}O_{3+x}$ (where x is 0 or more), a desired circuit pattern of the patterned aluminum oxide film being formed on the base substrate, no aluminum oxide film being disposed on the base substrate in regions other than the desired circuit pattern; and
a graphene film preferentially grown directly and only on the patterned aluminum oxide film, the graphene film having one or more graphene atomic layers, the graphene film growing parallel to a surface of the patterned aluminum oxide film, the graphene film consisting of a plurality of graphene domains having an average size from 25 to 41 nm, the plurality of graphene domains being electrically connected with one another, the graphene film having an electrical conductivity of $1\times10^4$ S/cm or more through the plurality of graphene domains.

13. The substrate according to claim 1, wherein the plurality of graphene domains have an average size from 30 to 41 nm.

14. The substrate according to claim 12, wherein the plurality of graphene domains have an average size from 30 to 41 nm.

* * * * *